US012615001B2

(12) United States Patent
Bourniche et al.

(10) Patent No.: US 12,615,001 B2
(45) Date of Patent: Apr. 28, 2026

(54) SYSTEMS FOR LOW INDUCTANCE FULL BRIDGE POWER MODULE FOR INVERTER

(71) Applicant: BorgWarner Luxembourg Automotive Systems SA, Bascharage (LU)

(72) Inventors: Eric Bourniche, Preutin-Higny (FR); Arnaud Leblay, Beuveille (FR); Pascal David, Luxembourg (LU)

(73) Assignee: BorgWarner Luxembourg Automotive Systems SA, Bascharage (LU)

( * ) Notice: Subject to any disclaimer, the term of this patent is extended or adjusted under 35 U.S.C. 154(b) by 267 days.

(21) Appl. No.: 18/619,887

(22) Filed: Mar. 28, 2024

(65) Prior Publication Data

US 2025/0309810 A1    Oct. 2, 2025

(51) Int. Cl.
*H05K 7/18* (2006.01)
*B60L 15/00* (2006.01)
*H02P 27/06* (2006.01)
*H05K 7/20* (2006.01)

(52) U.S. Cl.
CPC ............ *H02P 27/06* (2013.01); *B60L 15/007* (2013.01); *H05K 7/209* (2013.01); *B60L 2210/40* (2013.01)

(58) Field of Classification Search
CPC .... H02P 27/06; B60L 15/007; B60L 2210/40; H05K 7/209; H05K 7/18; H02M 7/003
See application file for complete search history.

(56) References Cited

U.S. PATENT DOCUMENTS

| | | | |
|---|---|---|---|
| 2009/0161301 A1 | 6/2009 | Woody et al. | |
| 2020/0337175 A1* | 10/2020 | Krivonak | H05K 7/18 |
| 2021/0078446 A1* | 3/2021 | Wang | H02M 7/003 |

FOREIGN PATENT DOCUMENTS

| | | |
|---|---|---|
| CN | 217426735 U | 9/2022 |
| DE | 102013219192 A1 | 3/2015 |
| JP | 2004364427 A | 12/2004 |

* cited by examiner

*Primary Examiner* — Cortez M Cook
(74) *Attorney, Agent, or Firm* — Joshua M. Haines; Bookoff McAndrews, PLLC

(57) ABSTRACT

A system including: first switches to receive positive DC power to generate the AC power, a positive DC power rail to provide the positive DC power to the first switches, positive DC power tabs connected to the positive DC power rail, second switches to receive negative DC power to generate the AC power, a negative DC power rail to provide the negative DC power to the second switches, negative DC power tabs connected to the negative DC power rail; and AC power tabs to receive the AC power from the first switches and the second switches, wherein the positive DC power rail is provided in a first plane on a first side of the first switches and the second switches, and the negative DC power rail is provided in a second plane on a second side of the first switches and the second switches and opposite to the first side.

20 Claims, 10 Drawing Sheets

BOTTOM VIEW - LOWER DBM REMOVED
600

TOP VIEW
600

TOP VIEW - UPPER DBM REMOVED
600

TOP VIEW - UPPER DBM REMOVED
800

TOP VIEW
800

TOP VIEW - UPPER DBM & DIES REMOVED
800

BOTTOM VIEW - LOWER DBM REMOVED
800

840

SYSTEMS FOR LOW INDUCTANCE FULL BRIDGE POWER MODULE FOR INVERTER

TECHNICAL FIELD

Various embodiments of the present disclosure relate generally to systems and methods for a low inductance phase switch for an inverter for an electric vehicle, and, more particularly, to systems and methods for a power module including low inductance phase switches for an inverter for an electric vehicle.

BACKGROUND

Inverters, such as those used to drive a motor in an electric vehicle, for example, are responsible for converting Direct Current (DC) into Alternating Current (AC) to drive the motor. In an inverter, loop inductance associated with a phase switch may affect switching losses of the switch.

The present disclosure is directed to overcoming one or more of these above-referenced challenges.

SUMMARY OF THE DISCLOSURE

In some aspects, the techniques described herein relate to a system including: an inverter to convert DC power from a battery to AC power to drive a motor, wherein the inverter includes: a power module including: one or more first switches to receive positive DC power to generate the AC power; a positive DC power rail to provide the positive DC power to the one or more first switches; one or more positive DC power tabs connected to the positive DC power rail; one or more second switches to receive negative DC power to generate the AC power; a negative DC power rail to provide the negative DC power to the one or more second switches; one or more negative DC power tabs connected to the negative DC power rail; and one or more AC power tabs to receive the AC power from the one or more first switches and the one or more second switches, wherein the positive DC power rail is provided in a first plane on a first side of the one or more first switches and the one or more second switches, and the negative DC power rail is provided in a second plane on a second side of the one or more first switches and the one or more second switches and opposite to the first side.

In some aspects, the techniques described herein relate to a system, wherein the one or more AC power tabs include: a first AC power tab to be connected to a first phase of the motor; a second AC power tab to be connected to a second phase of the motor; and a third AC power tab to be connected to a third phase of the motor.

In some aspects, the techniques described herein relate to a system, wherein the one or more first switches includes a first transistor and a second transistor, the first transistor and the second transistor configured to generate a single phase of the AC power.

In some aspects, the techniques described herein relate to a system, wherein the one or more positive DC power tabs include: a first positive DC power tab connected to the positive DC power rail, and a second positive DC power tab connected to the positive DC power rail, and wherein the one or more negative DC power tabs include: a first negative DC power tab connected to the negative DC power rail and provided between the first positive DC power tab and the second positive DC power tab.

In some aspects, the techniques described herein relate to a system, wherein the one or more negative DC power tabs include: a first negative DC power tab connected to the negative DC power rail, and a second negative DC power tab connected to the negative DC power rail, and wherein the one or more positive DC power tabs include: a first positive DC power tab connected to the positive DC power rail and provided between the first negative DC power tab and the second negative DC power tab.

In some aspects, the techniques described herein relate to a system, wherein the power module further includes a high side gate pin and a low side gate pin.

In some aspects, the techniques described herein relate to a system, wherein the one or more positive DC power tabs and the one or more negative DC power tabs are provided on an opposite side of the power module from the one or more AC power tabs.

In some aspects, the techniques described herein relate to a system, wherein the inverter further includes one or more heat sinks for the power module.

In some aspects, the techniques described herein relate to a system, further including: the battery configured to supply the DC power to the inverter; and the motor configured to receive the AC power from the inverter to drive the motor, wherein the system is provided as a vehicle including the inverter, the battery, and the motor.

In some aspects, the techniques described herein relate to a system including a power module for an inverter, the power module including: a positive DC power rail to provide positive DC power, the positive DC power rail including an inner layer and an outer layer; a negative DC power rail to provide negative DC power, the negative DC power rail including an inner layer and an outer layer, wherein the inner layer of the negative DC power rail faces the inner layer of the positive DC power rail so that at least a portion of the negative DC power rail overlaps the positive DC power rail; a first switch connected to the inner layer of the positive DC power rail to receive the positive DC power; a second switch connected to the inner layer of the negative DC power rail to receive the negative DC power; and one or more AC power tabs to receive AC power from the first switch and the second switch.

In some aspects, the techniques described herein relate to a system, the power module further including: a first substrate including an inner layer and an outer layer, wherein the inner layer of the first substrate is connected to the outer layer of the positive DC power rail; a second substrate including an inner layer and an outer layer, wherein the inner layer of the second substrate is connected to the outer layer of the negative DC power rail; a first AC power rail connected to the inner layer of the first substrate, a first side of the first switch and the one or more AC power tabs; and a second AC power rail connected to the inner layer of the second substrate a second side of the second switch, and the one or more AC power tabs.

In some aspects, the techniques described herein relate to a system, wherein the power module further includes: a third switch connected to the inner layer of the positive DC power rail to receive positive DC power; and a fourth switch connected to the inner layer of the negative DC power rail to receive negative DC power, wherein a die planar orientation of the third switch is the same as a die planar orientation of the first switch, and a die planar orientation of the fourth switch is the same as a die planar orientation of the second switch.

In some aspects, the techniques described herein relate to a system, wherein the power module further includes: a fifth switch connected to the inner layer of the positive DC power rail to receive positive DC power; and a sixth switch connected to the inner layer of the negative DC power rail to receive negative DC power, wherein a die planar orientation of the fifth switch is the same as the die planar orientation of the first switch, and a die planar orientation of the sixth switch is the same as the die planar orientation of the second switch.

In some aspects, the techniques described herein relate to a system, wherein: the first switch and the second switch generate a first phase of the AC power, the third switch and the fourth switch generate a second phase of the AC power, and the fifth switch and the sixth switch generate a third phase of the AC power.

In some aspects, the techniques described herein relate to a system, wherein the one or more AC power tabs include: a first AC power tab to receive the first phase of the AC power and to be connected to a first phase of a motor; a second AC power tab to receive the second phase of the AC power and to be connected to a second phase of the motor; and a third AC power tab to receive the third phase of the AC power and to be connected to a third phase of the motor.

In some aspects, the techniques described herein relate to a system, wherein the power module further includes a high side gate pin and a low side gate pin.

In some aspects, the techniques described herein relate to a system, wherein the first switch includes a first transistor and a second transistor, the first transistor and the second transistor configured to generate a single phase of the AC power.

In some aspects, the techniques described herein relate to a system including a power module, the power module including: one or more first switches to receive positive DC power to generate AC power; a positive DC power rail to provide positive DC power to the one or more first switches; one or more positive DC power tabs connected to the positive DC power rail; one or more second switches to receive negative DC power to generate the AC power; a negative DC power rail to provide negative DC power to the one or more second switches; one or more negative DC power tabs connected to the negative DC power rail; and one or more AC power tabs to receive the AC power from the one or more first switches and the one or more second switches, wherein the positive DC power rail is provided in a first plane on a first side of the one or more first switches and the one or more second switches, and the negative DC power rail is provided in a second plane on a second side of the one or more first switches and the one or more second switches and opposite to the first side.

In some aspects, the techniques described herein relate to a system, further including: a battery configured to supply the positive DC power and the negative DC power to the power module; and a motor configured to receive the AC power from the power module to drive the motor, wherein the system is provided as a vehicle including the power module, the battery, and the motor.

In some aspects, the techniques described herein relate to a system, wherein the AC power is provided as one or more phases.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
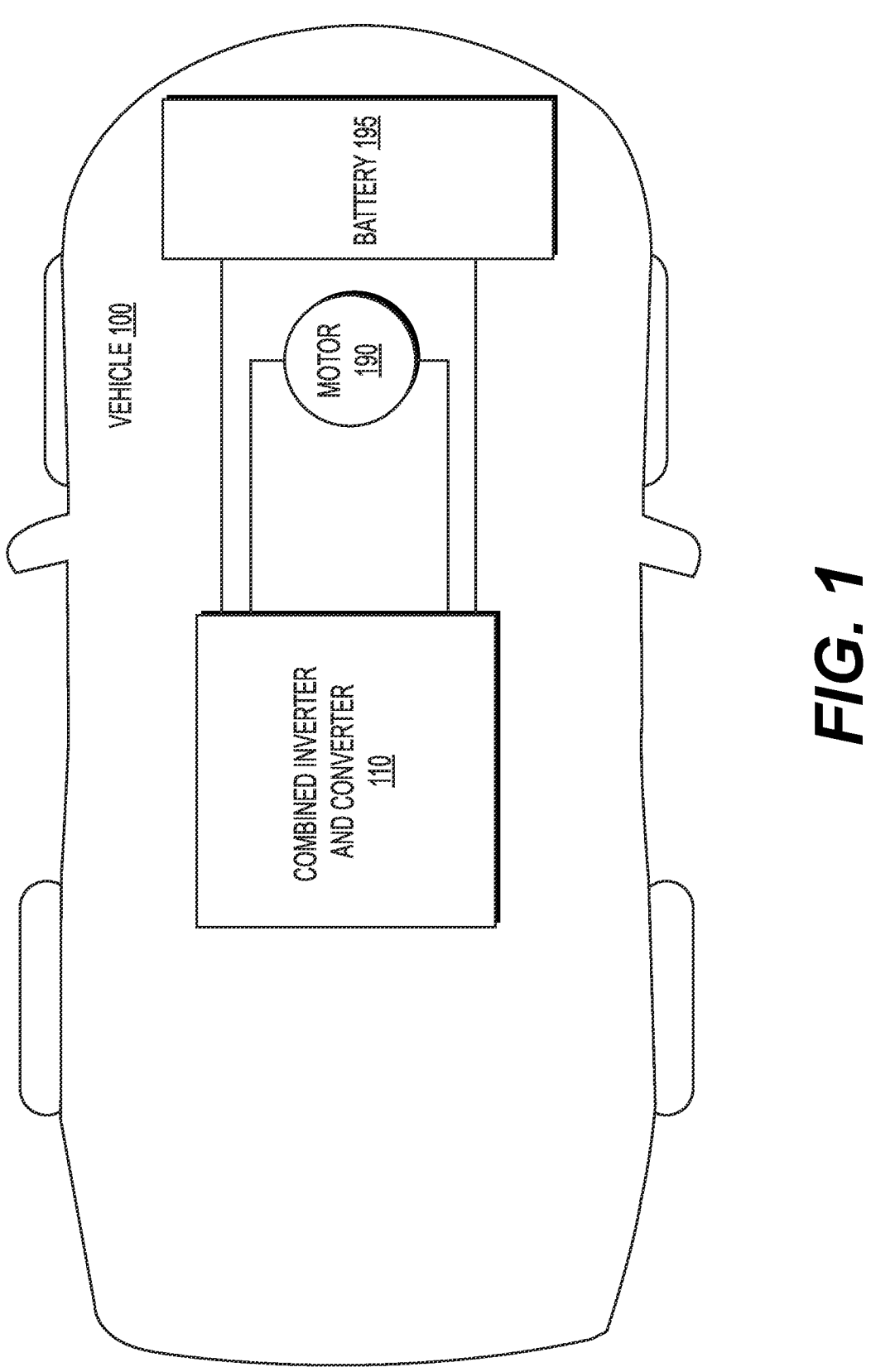
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a low inductance phase switch for an inverter for an electric vehicle, and, more particularly, to systems and methods for a power module including low inductance phase switches for an inverter for an electric vehicle. Inverters, such as those used to drive a motor in an electric vehicle, for example, are responsible for converting Direct Current (DC) into Alternating Current (AC) to drive the motor. A three phase inverter may include a bridge with six power device switches (for example, power transistors such as IGBT or MOSFET) that are controlled by Pulse Width Modulation (PWM) signals generated by a controller.

Some power modules include six power switches placed between two heat sinks (e.g., double side cooling), forming a three phase, two level inverter. Each power switch has the function of a power switch of the full bridge inverter. The quantity of the embedded power silicon (e.g., Si or SiC) can vary in size (e.g., from 4 to 8 SiC dies per power switch), and the size of dies can vary (e.g., from approximately 25 mm$^2$ to approximately 28 mm$^2$ for SiC). As a result, requirements of a power module construction may include a large range (e.g., from approximately 275 Arms to approximately 530 Arms (800V system) and from approximately 146 kW to approximately 282 kW, and from approximately 325 Arms to approximately 600 Arms (400V system) and from approximately 87 kW to approximately 160 kW). For power electronic cooling performance, the current density may increase from less than approximately 3 A/mm$^2$ to more than approximately 4 A/mm$^2$, leading to a potential increase of approximately 25% in the power delivered by power module.

With the advent of electric vehicles, driving three phase motors more efficiently may be becoming increasingly important. Three phase motors may be driven with three half-H or phase switches that switch the motor phase connections between a positive high voltage direct current voltage source (HVDC+) and a negative high voltage direct current voltage source (HVDC−). The loop inductance associated with the phase switches may be important, and may be even more important as silicon carbide (SiC) devices become more prevalent. Lower loop inductance may be especially important with fast SiC devices as lower loop inductance may allow faster switching times while maintaining appropriate voltage along with appropriate current overshoots and ringing.

As technology progresses, internal combustion engine (ICE) vehicles will be phased out to include more vehicles with an electric powertrain, including A to C segment vehicles. Some solutions may provide a "smallest" 800V power module with 4 dies per power switch that may have (146+25%) approximately 180 kW capability (e.g., not suitable for vehicles of segment A, B, and C that require 50 kW to 150 kW), and may provide a "smallest" 400V power module with 4 dies per power switch that may have (87+25%) approximately 109 kW (e.g., not suitable for vehicles of segment A and B that require 50 kW to 100 kW).

Phase switches may be made of two individual power switches in separate packages (e.g. two power modules) or two individual power switches in a single integrated package (e.g. a single power module). In a single sided cooling system, the power switches may be mounted side-by-side in order for each power switch to have a good thermal path to the heat sink of the cooling system. This side-by-side arrangement may limit a reduction of the loop area that creates the loop inductance. In a two-sided cooling system, the power switches may be mounted side-by-side in order to maximize the effectiveness of the dual heatsinks of the cooling system. This side-by-side arrangement may also limit a reduction of the loop area that creates the loop inductance. As higher cost SiC devices are used along with increased switching frequencies, switching losses may become a significant portion of the overall losses of the power module.

One or more embodiments may include high capacity, high power density, reduced stray inductance for increased efficiency, and low-cost and scalable solution for low power applications (e.g., vehicle segments A to C). Some solutions may include six power switches (e.g., 4 to 8 dies) and six AC terminals to provide a connection between the power switch pairs at an AC terminal side, and six DC terminals to provide three DC+ connections and three DC− connections. One or more embodiments may include a structure of the power module with dies placed between dual Direct Bonding Material plates (DBM), while reducing a number of terminal connections relative to some solutions. One or more embodiments may include electrical terminals corresponding to two high voltage terminals for DC side connections (e.g., DC+ and DC−), three high voltage terminals for AC side connections (e.g., phase U, V, and W), five high voltage terminals for the AC side electrical voltage measurement (e.g., Kelvin pins), six low voltage terminals for gate signals (e.g., three high side and three low side), and two terminals for temperature sensing (e.g., optional, with a number of terminals less than two or more than two).

One or more embodiments may include one package (e.g., 6 to 12 dies), internal connections of half bridges for AC phases, and single DC+ and DC− connections to a bulk capacitor. One or more embodiments may be suitable for current from approximately 72 Arms to approximately 252 Arms per module (with current improvement of approximately 4 A/mm$^2$). One or more embodiments may include one or more dies forming switches Q1, Q3, and Q5 having drains connected to the DC+, and one or more dies forming switches Q4, Q6, Q2 having drains connected to the phase leads U, V, and W. One or more embodiments may include six gate leads having the same geometry for all phases, which may enhance the balance of current distribution to provide better electrical behavior.

One or more embodiments may include soldered dies. One or more embodiments may include a configuration with four dies per phase (e.g., or other numbers of dies, such as two or three). One or more embodiments may include four dies having the same distance between the AC and DC tabs. One or more embodiments may include each direct bonding material (DBM) connected to both DC and AC side terminals. One or more embodiments may include overlapping of DC+ and DC− terminals to reduce the parasitic inductance. One or more embodiments may include a structure with an internal geometry of bridges and connections being the same, which may reduce the risk of impedance unbalance and overstress of one bridge compared to another.

One or more embodiments may include the internal arrangement of DC+ and DC− leads that are overlapped on a portion on their respective area. The overlapping portions may result in a reduced stray inductance of this electrical connection, which may be beneficial for higher switching speed and higher efficiency. One or more embodiments may include a 12 die configuration (e.g., two dies per phase). One or more embodiments may include a 6 dies per power module (e.g., at minimum one die per phase) or 18 dies per power module (e.g., three dies per phase) or more if higher current capability is required.

One or more embodiments may include an area of each die that can be reduced (e.g., from approximately 28 mm² to approximately 15 mm²) in order to fine tune the current capability regarding to the vehicle requirement. One or more embodiments may include a design compatible with an embedded decoupling capacitor installed between DC+ and DC– leads within the inter-DBM volume (e.g., closest to the dies) in order to achieve higher switching speed and increase efficiency.

One or more embodiments may provide advantages including high compacity, high power density, reduced stray inductance for increased efficiency, and low cost and scalable solutions for low power applications (e.g., vehicle segments A to C). One or more embodiments may provide improvements including the cost for the complete power module may be reduced compared to some power module designs with the six power switches, and the efficiency of the power module switching losses may be reduced due to the high switching speed capability allowed by low stray inductance (and optional embedded decoupling capacitors). One or more embodiments may include a design with a current density of approximately 4 Arms/mm², where pressure drop allocated to the power module may be focused on a smaller heat sink and thus a higher heat transfer coefficient may be achieved. One or more embodiments may include a 3D printed heat sink (e.g., removing the Thermal Interface Material layer on both sides) and dual side sintered dies. One or more embodiments may provide a power module with a high power density that may be compatible with segment A to C vehicles.

FIG. 1 depicts an exemplary system infrastructure for a vehicle including a combined inverter and converter, according to one or more embodiments. Alternatively, the inverter may be an inverter without a converter. In the context of this disclosure, the inverter without a converter, or the combined inverter and converter, may be referred to as an inverter. As shown in FIG. 1, electric vehicle 100 may include an inverter 110, a motor 190, and a battery 195. The inverter 110 may include components to receive electrical power from an external source and output electrical power to charge the battery 195 of electric vehicle 100. The inverter 110 may convert DC power from the battery 195 in electric vehicle 100 to AC power, to drive (e.g. rotate) the motor 190 of the electric vehicle 100, for example, but the embodiments are not limited thereto. The inverter 110 may be bidirectional, and may convert DC power to AC power, or convert AC power to DC power, such as during regenerative braking, for example. The inverter 110 may be a three-phase inverter, a single-phase inverter, or a multi-phase inverter.

Figure 2:
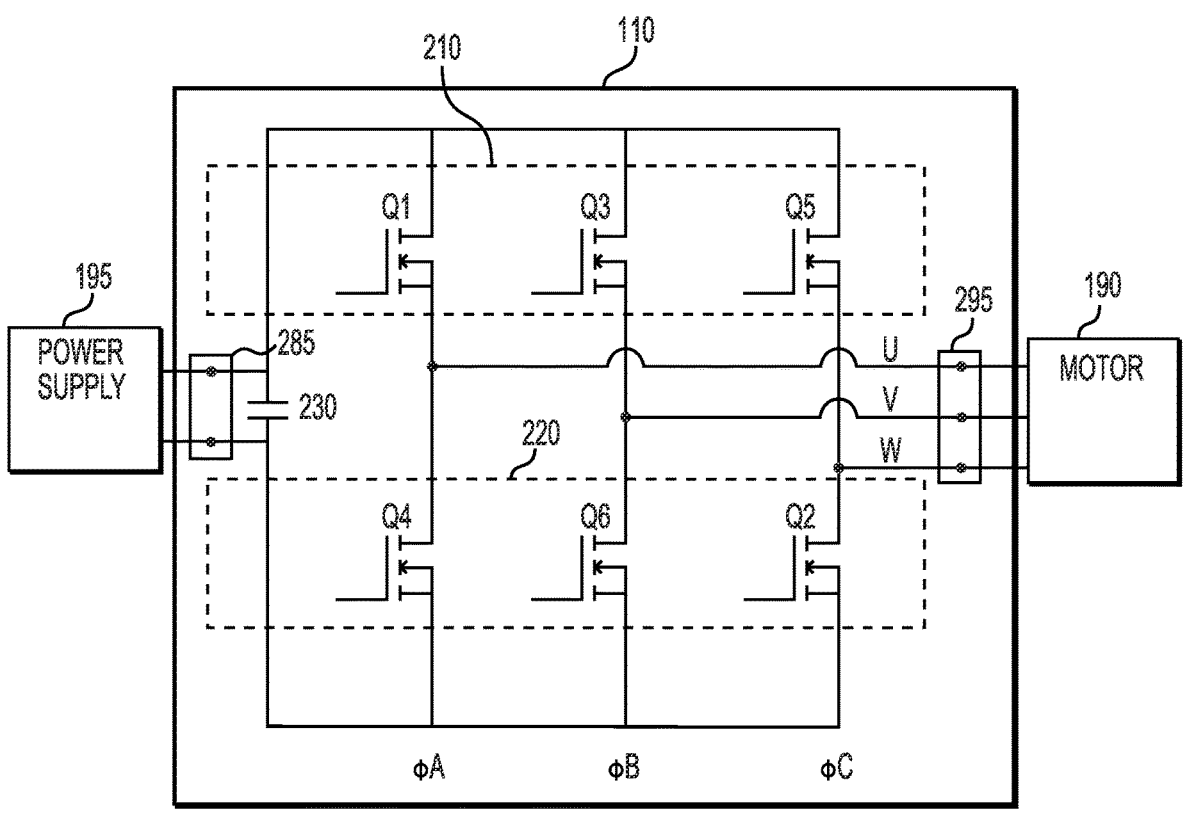
FIG. 2 depicts an electrical power schematic of a three phase inverter module in a connected system, according to one or more embodiments.

FIG. 2 depicts an electrical power schematic of a three phase inverter module, according to one or more embodiments. As shown in FIGS. 1 and 2, the inverter 110 may be connected to the battery 195 and the motor 190. Battery 195 may be any power supply, and motor 190 may be any load. The inverter 110 may include first three-phase switch group 210, and second three-phase switch group 220. A first phase U may correlate with OA including switches Q1 and Q4, a second phase V may correlate with OB including switches Q3 and Q6, and a third phase W may correlate with OC including switches Q5 and Q2, as illustrated in FIG. 2. The first three-phase switch group 210 may include first phase switch Q1, second phase switch Q3, and third phase switch Q5. The second three-phase switch group 220 may include first phase switch Q4, second phase switch Q6, and third phase switch Q2. The switches Q1-Q6 may be metal-oxidesemiconductor field-effect transistors (MOSFET), for example, but are not limited thereto.

The first three-phase switch group 210 and second three-phase switch group 220 may be driven by a PWM signal generated by inverter controller 300 (shown in FIG. 3) to convert DC power delivered via input terminal set 285 at capacitor 230 to three phase AC power at outputs U, V, and W via output terminal set 295 to the motor 190. Additionally, although FIGS. 1 and 2 illustrate a three-phase inverter, the disclosure is not limited thereto, and may include single phase or multi-phase inverters.

Figure 3:
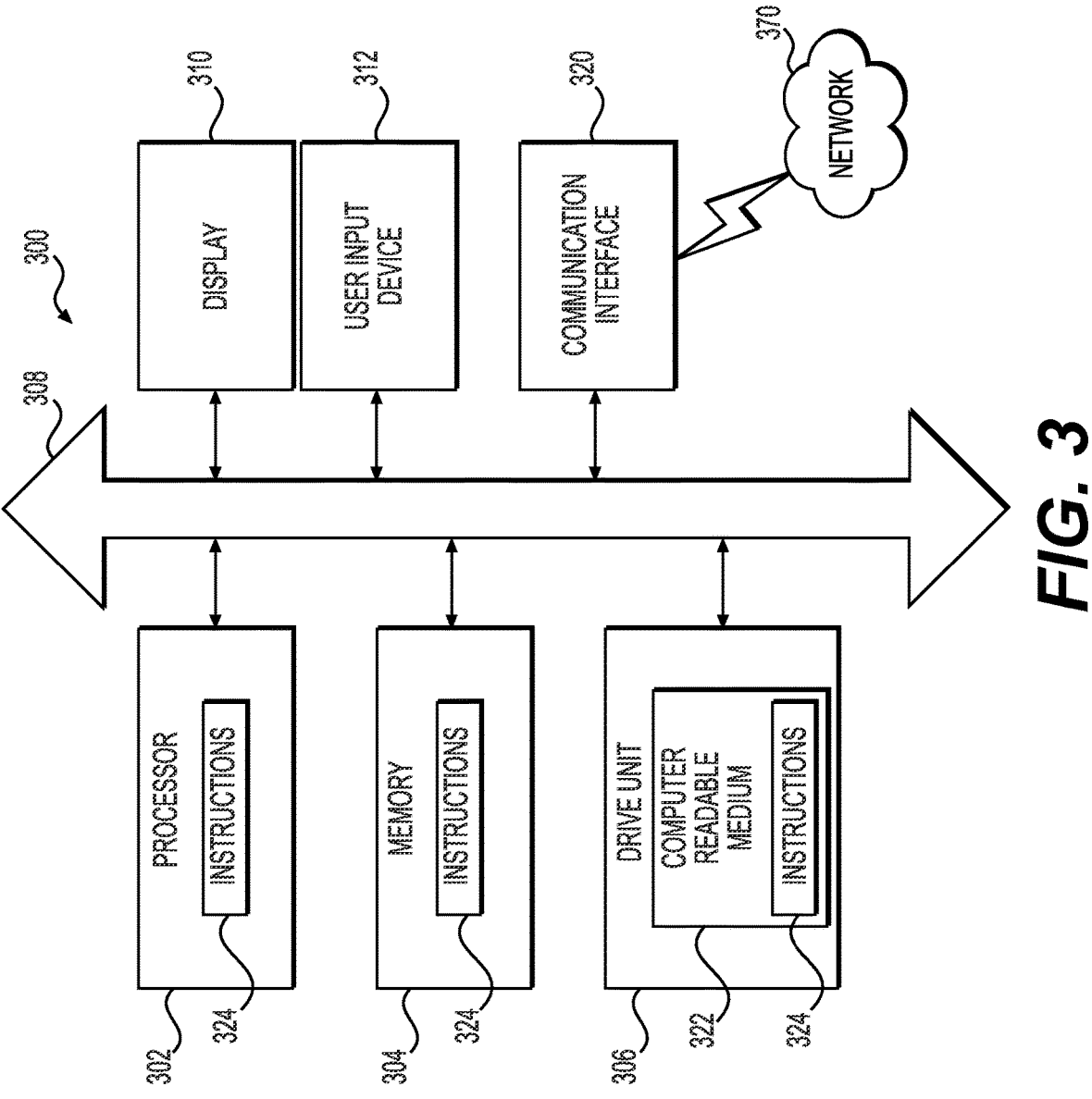
FIG. 3 depicts an implementation of a computer system that may execute techniques presented herein, according to one or more embodiments.

FIG. 3 depicts an exemplary system infrastructure for the inverter controller 300 of FIG. 2, according to one or more embodiments. The inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of the inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which instructions 324 (e.g., one or more sets of instructions), e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, the computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
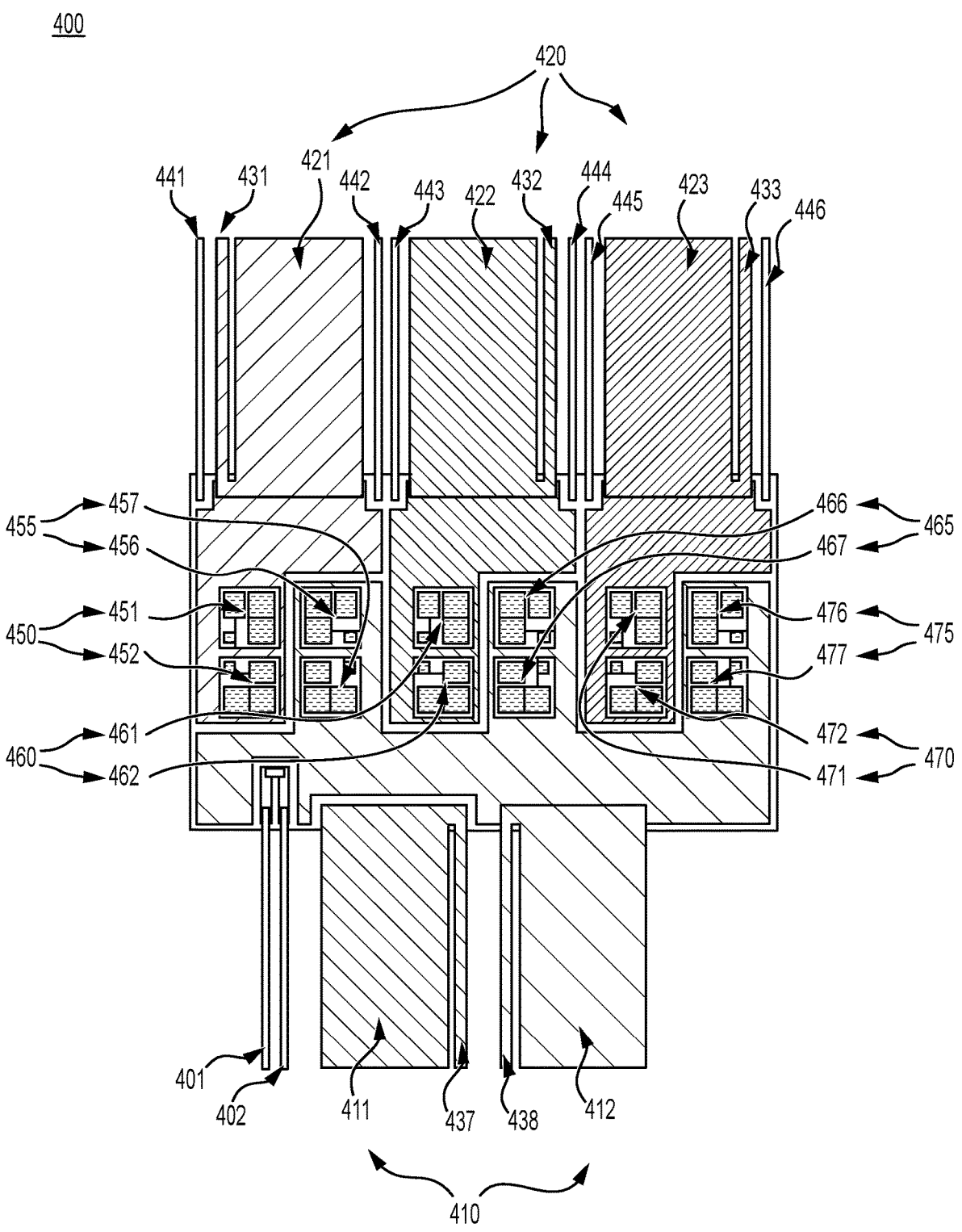
FIG. 4 depicts a top view of an exemplary power module, according to one or more embodiments.

FIG. 4 depicts a top view of an exemplary power module, according to one or more embodiments. Power module 400 may include first temperature pin 401 and second temperature pin 402. The first temperature pin 401 and second temperature pin 402 may be optional and/or may include any number of temperature pins. Power module 400 may include DC power tab group 410. DC power tab group 410 may include one or more tabs that are connected to a power rail (e.g., positive DC power rail 530) and/or one or more tabs that are integrally formed with a power rail as a single component. DC power tab group 410 may include negative DC power tab 411 and positive DC power tab 412. Negative DC power tab 411 may include kelvin pin 437. Positive DC power tab 412 may include kelvin pin 438. Power module 400 may include AC power tab group 420. AC power tab group 420 may include a first AC power tab 421, a second AC power tab 422, and a third AC power tab 423. First AC power tab 421 may include kelvin pin 431, second AC power tab 422 may include kelvin pin 432, and third AC power tab 423 may include kelvin pin 433.

Power module 400 may include a low side gate pin 441 and a high side gate pin 442 associated with first AC power tab 421. Power module 400 may include a low side gate pin 443 and a high side gate pin 444 associated with second AC power tab 422. Power module 400 may include a low side gate pin 445 and a high side gate pin 446 associated with third AC power tab 423. Power module 400 may include negative DC power tab 411 and positive DC power tab 412 on an opposite side of power module 400 from first AC power tab 421, second AC power tab 422, and third AC power tab 423.

Power module 400 may include first switch 450, second switch 455, third switch 460, fourth switch 465, fifth switch 470, and sixth switch 475. For example, with reference to FIG. 2, first switch 450 may correlate with switch Q4, second switch 455 may correlate with switch Q1, third switch 460 may correlate with switch Q6, fourth switch 465 may correlate with switch Q3, fifth switch 470 may correlate with switch Q2, and sixth switch 475 may correlate with switch Q5.

First switch 450 may include transistor 451 and transistor 452. Second switch 455 may include transistor 456 and transistor 457. Third switch 460 may include transistor 461 and transistor 462. Fourth switch 465 may include transistor 466 and transistor 467. Fifth switch 470 may include transistor 471 and transistor 472. Sixth switch 475 may include transistor 476 and transistor 477.

Power module 400 may include positive DC power rail 530 (See FIG. 5) to provide the positive DC power to second switch 455, fourth switch 465, and sixth switch 475. Power module 400 may include positive DC power tab 412 connected to the positive DC power rail 530. Power module 400 may include a negative DC power rail 540 (See FIG. 5) to provide the negative DC power to first switch 450, third switch 460, and fifth switch 470. Power module 400 may include negative DC power tab 411 connected to the negative DC power rail 540 (See FIG. 5). First AC power tab 421 may receive the first phase AC power from first switch 450 and second switch 455. Second AC power tab 422 may receive second phase AC power from third switch 460 and fourth switch 465. Third AC power tab 423 may receive third phase AC power from fifth switch 470 and sixth switch 475.

First switch 450, third switch 460, and fifth switch 470 may have a same die planar orientation (e.g., a gate of each switch may be in a same location on a die). Transistor 451, transistor 461, and transistor 471 may have a same die planar orientation. Transistor 452, transistor 462, and transistor 472 may have a same die planar orientation. Second switch 455, fourth switch 465, and sixth switch 475 may have a same die planar orientation. Transistor 456, transistor 466, and transistor 476 may have a same die planar orientation. Transistor 457, transistor 467, and transistor 477 may have a same die planar orientation. Power module 400 may be a three-phase inverter module (See FIG. 2). First AC power tab 421 may be configured to connect to a first phase of motor 190. Second AC power tab 422 may be configured to connect to a second phase of motor 190. Third AC power tab 423 may be configured to connect to a third phase of motor 190.

Figure 5:
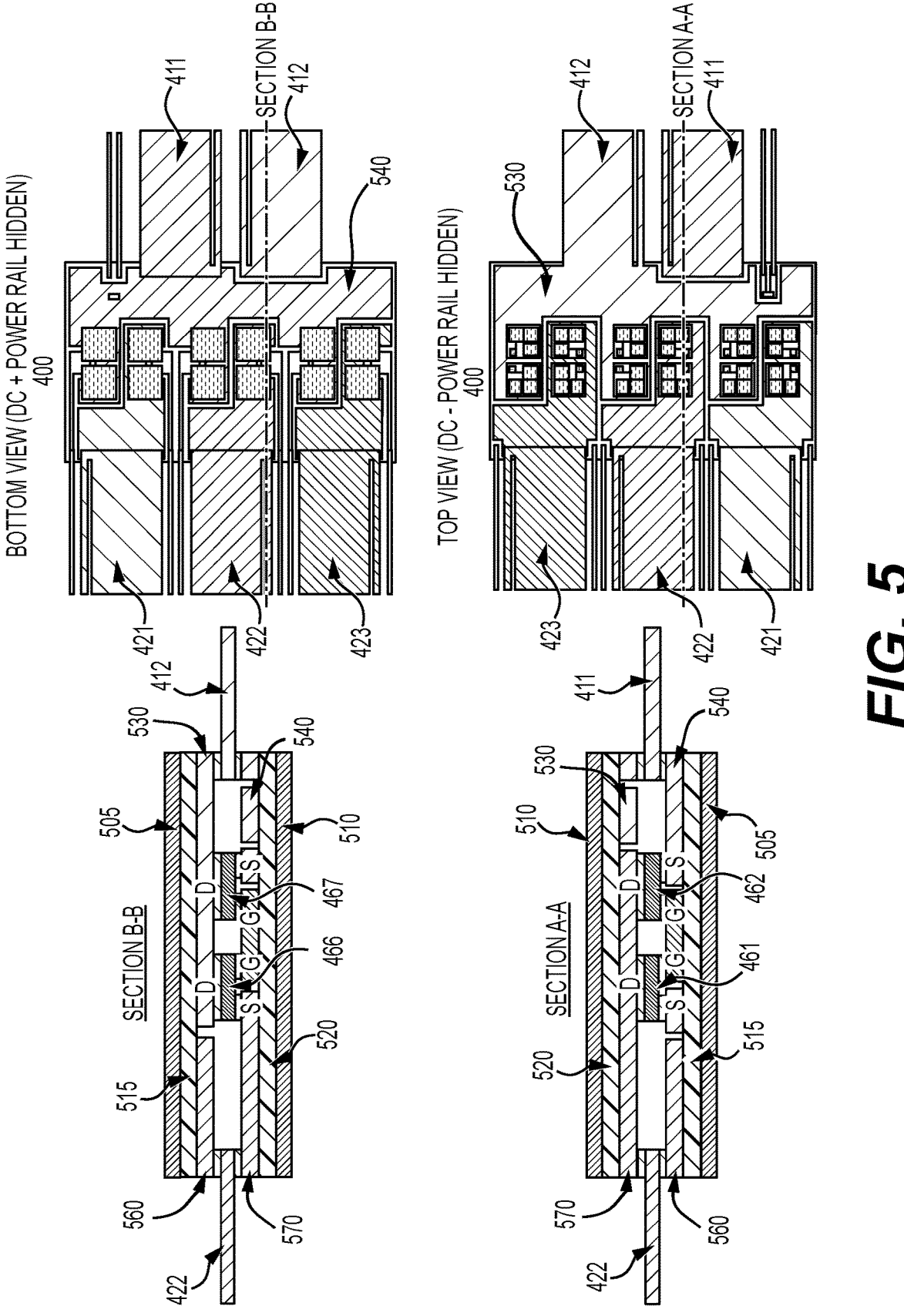
FIG. 5 depicts a top view and bottom view with associated cross-section views of an exemplary power module, according to one or more embodiments.

FIG. 5 depicts a top view and bottom view with associated cross-section views of an exemplary power module, according to one or more embodiments. FIG. 5 depicts cross-section view A-A of negative DC power tab 411, third switch 460 including transistor 461 and transistor 462, and second AC power tab 422. FIG. 5 depicts cross-section view B-B of positive DC power tab 412, fourth switch 465 including transistor 466 and transistor 467, and second AC power tab 422. As depicted in FIG. 5, negative DC power tab 411 may be connected to (or integrated with) negative DC power rail 540. Positive DC power tab 412 may be connected to (or integrated with) positive DC power rail 530.

Positive DC power rail 530 may include an inner layer facing the switches and an outer layer facing away from the switches. Negative DC power rail 540 may include an inner layer facing the switches and an outer layer facing away from the switches. The inner layer of the negative DC power rail 540 may face the inner layer of the positive DC power rail 530. At least a portion of the negative DC power rail 540 overlaps the positive DC power rail 530 (e.g., a portion of positive DC power rail 530 between positive DC power tab 412 and second switch 455, fourth switch 465, and sixth switch 475 overlaps a portion of negative DC power rail 540 between positive DC power tab 412 and second switch 455, fourth switch 465, and sixth switch 475).

The third switch 460 may be connected to the inner layer of the negative DC power rail 540 to receive the negative DC power. Second AC power tab 422 may receive AC power from the third switch 460. Power module 400 may include a first substrate 515 including an inner layer and an outer layer. The inner layer of the first substrate 515 may be connected to the outer layer of the positive DC power rail 530, the outer layer of negative DC power rail 540, and the outer layer of first AC power rail 560. The outer layer of the first substrate 515 may be connected to a heat transfer layer 505. Power module 400 may include a second substrate 520 including an inner layer and an outer layer. The inner layer of the second substrate 520 may be connected to the inner layer of the negative DC power rail 540, the outer layer of positive DC power rail 530, and the outer layer of second AC power rail 570. The outer layer of the second substrate 520 may be connected to a heat transfer layer 510.

Power module may include a first AC power rail 560 connected to the inner layer of the first substrate 515, a first side of transistor 461 of third switch 460, a first side of transistor 462 of third switch 460, and second AC power tab 422. Power module 400 may include a second AC power rail 570 connected to the inner layer of the second substrate 520, a second side of transistor 461 of third switch 460, a second side of transistor 462 of third switch 460, and second AC power tab 422. The positive DC power rail 530 may be provided in a first plane on a first side of the third switch 460, and the negative DC power rail 540 may be provided in a second plane on a second side of the third switch 460 and opposite to the first side.

Fourth switch 465 may be connected to the inner layer of the positive DC power rail 530 to receive the positive DC power. Second AC power tab 422 may receive AC power from fourth switch 465. Power module may include a first AC power rail 560 connected to the inner layer of the first substrate 515, and second AC power tab 422. Power module 400 may include a second AC power rail 570 connected to the inner layer of the second substrate 520, a first side of fourth switch 465, a second side of third switch 460, and second AC power tab 422.

Figures 6A, 6B, 6C:
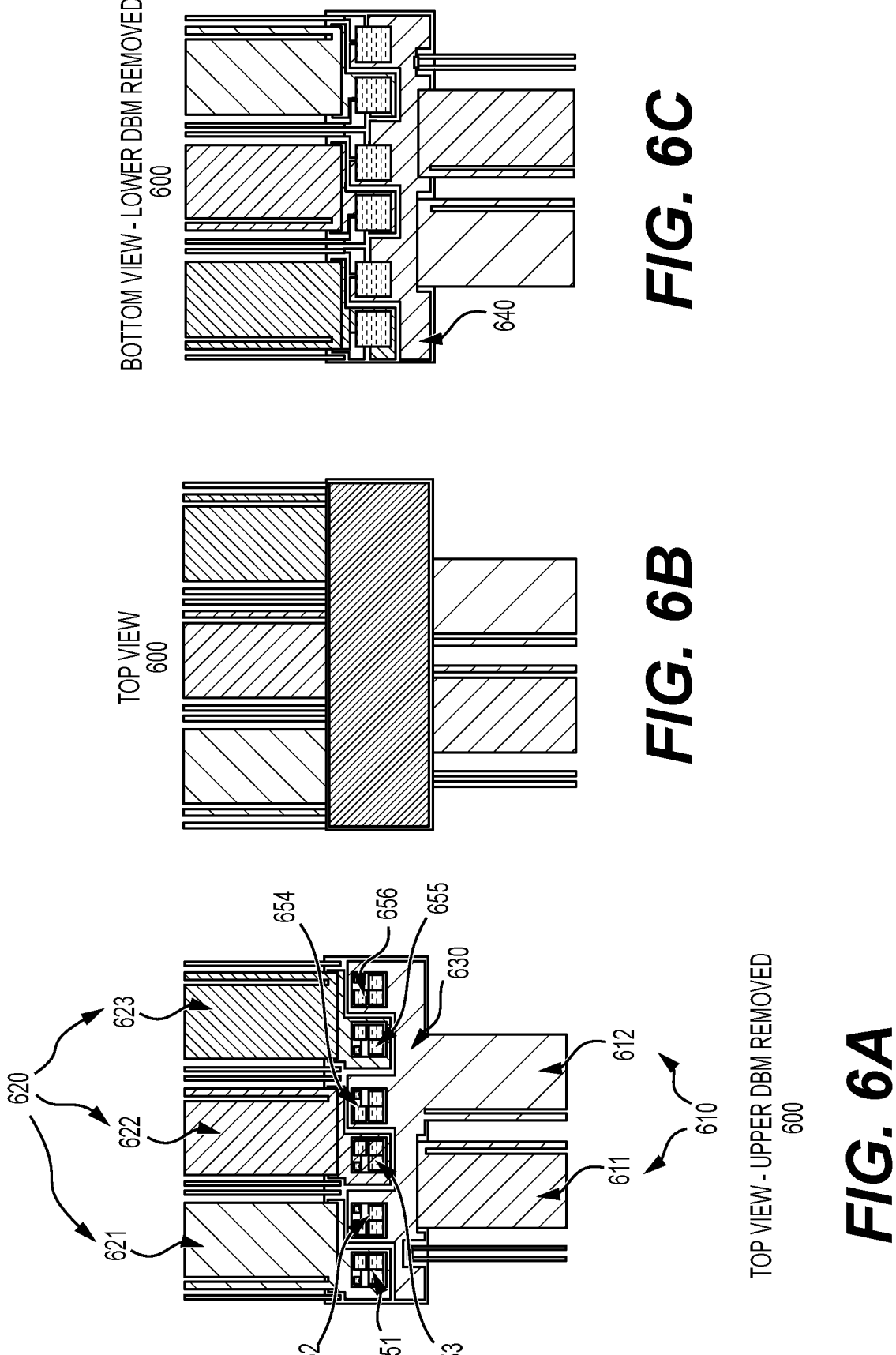
FIGS. 6A, 6B, and 6C depict top and bottom views of an exemplary power module, according to one or more embodiments.

FIGS. 6A, 6B, and 6C depict top and bottom views of an exemplary power module, according to one or more embodiments. FIG. 6A depicts a top view of power module 600 with first substrate 515 removed. For brevity, power module 400 (See FIG. 4) and power module 600 may contain many similarities which will not be discussed. Power module 600 may include DC power tab group 610, which may be similar to DC power tab group 410 in FIG. 4. The DC power tab group 610 of power module 600 may include a negative DC power tab 611 and a positive DC power tab 612. Positive DC power tab 612 may be connected to (or integrated with) positive DC power rail 630.

Power module 600 may include a first switch 651 including a transistor. Power module 600 may include a second switch 652 including a transistor. Power module 600 may include a third switch 653 including a transistor. Power module 600 may include a fourth switch 654 including a transistor. Power module 600 may include a fifth switch 655 including a transistor. Power module 600 may include a sixth switch 656 including a transistor.

Power module 600 may include AC power group 620. AC power group 620 may include first AC power tab 621, second AC power tab 622, and third AC power tab 623. First AC power tab 621 may receive the first phase AC power from first switch 651 and second switch 652. Second AC power tab 622 may receive second phase AC power from third switch 653 and fourth switch 654. Third AC power tab 623 may receive third phase AC power from fifth switch 655 and sixth switch 656.

FIG. 6B depicts a top view of power module 600. With reference to FIG. 5, power module 600 may include first substrate 515 and second substrate 520. FIG. 6C depicts a bottom view of power module 600 with second substrate 520 and switches (e.g., first switch 651, second switch 652, third switch 653, fourth switch 654, fifth switch 655, and sixth switch 656) removed. Negative DC power tab 611 may be connected to (or integrated with) negative DC power rail 640.

Figure 7B:
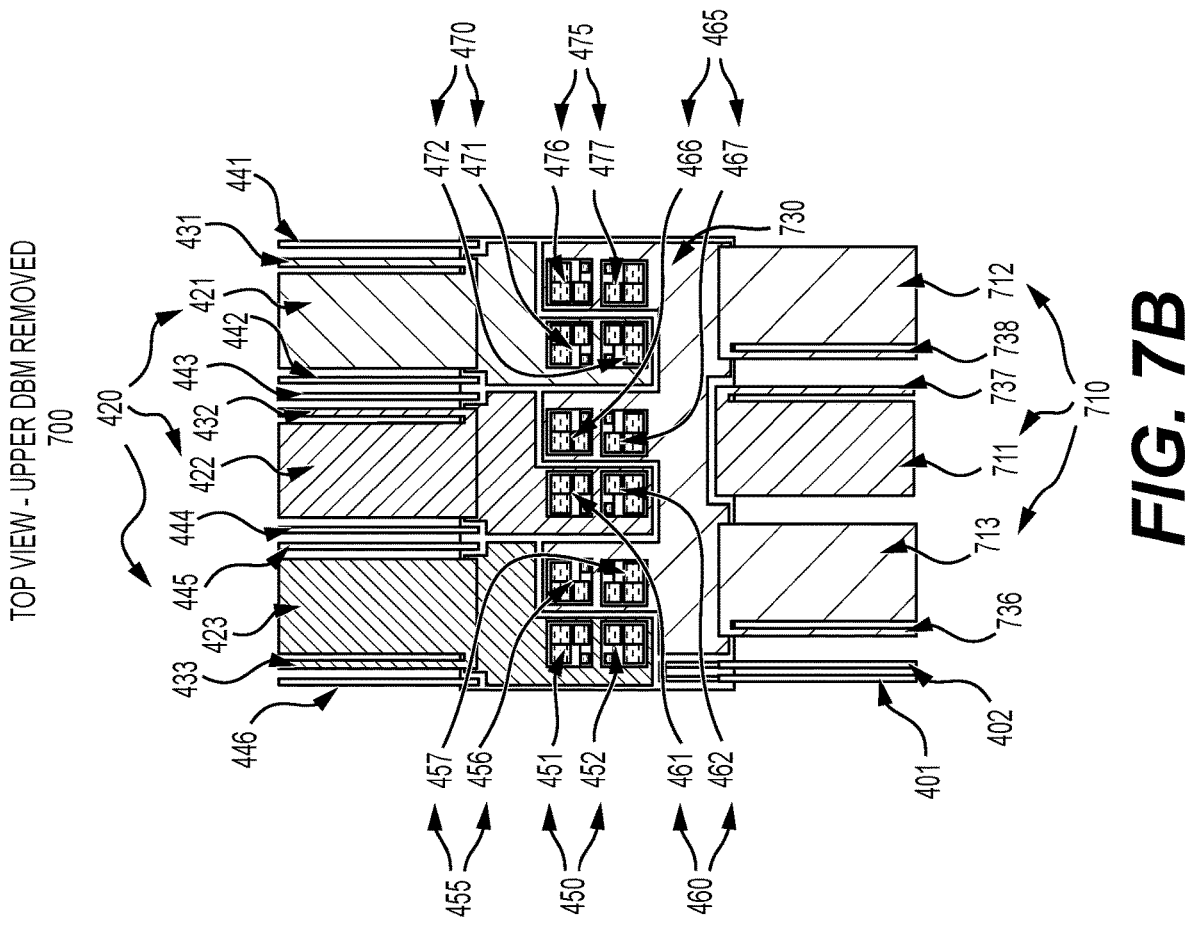
FIGS. 7A, 7B, 7C, and 7D depict top and bottom views of an exemplary power module, according to one or more embodiments.
Figure 7A:
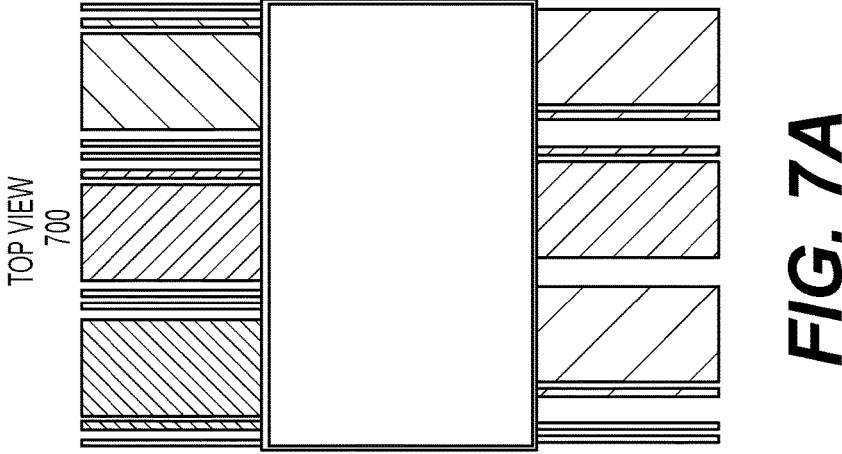

FIGS. 7A, 7B, 7C, and 7D depict top and bottom views of an exemplary power module, according to one or more embodiments. FIG. 7A depicts a top view of power module 700. With reference to FIG. 5, power module 700 may include first substrate 515 and second substrate 520. FIG. 7B depicts a top view of power module 700 with first substrate 515 removed. For brevity, power module 400 (See FIG. 4) and power module 700 may contain many similarities which will not be discussed.

Power module 700 may include DC power tab group 710, which may be similar to DC power tab group 410 in FIG. 4. DC power tab group 710 of power module 700 may include a negative DC power tab 711, a first positive DC power tab 712, and a second positive DC power tab 713. Negative DC power tab 711 may include kelvin pin 737. First positive DC power tab 712 may include kelvin pin 738. Second positive DC power tab 713 may include kelvin pin 736. First positive DC power tab 712 and second positive DC power tab 713 may be connected to positive DC power rail 730.

Figure 7D:
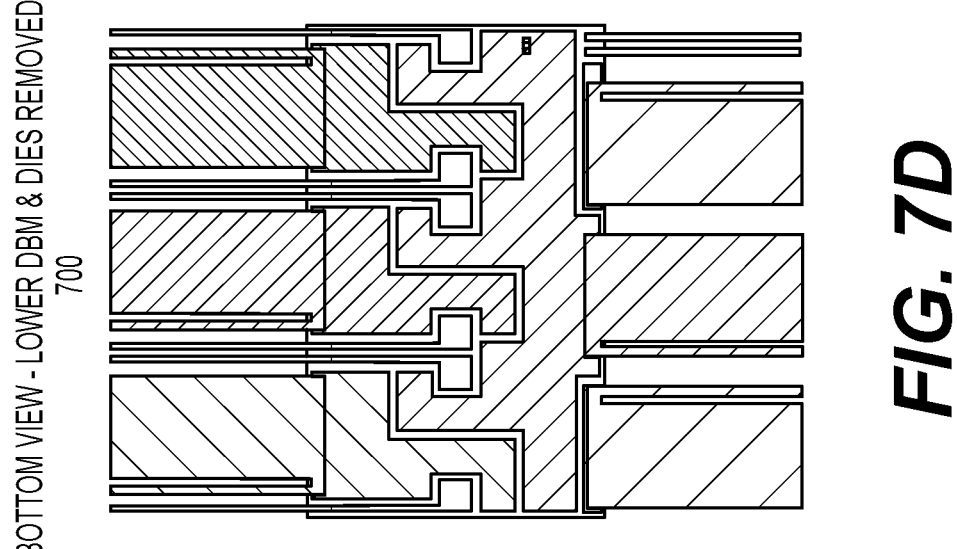
Figure 7C:
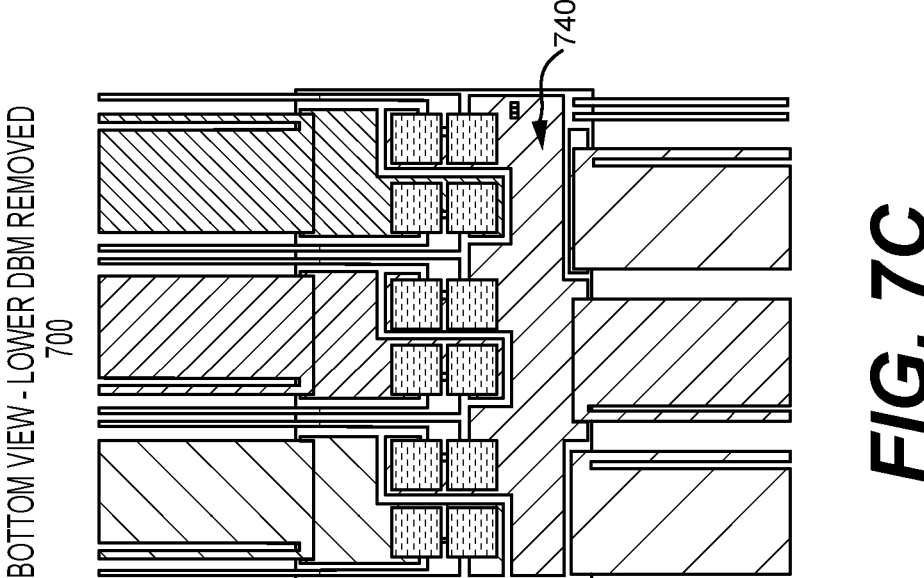

FIG. 7C depicts a bottom view of power module 700 with second substrate 520 removed. Negative DC power tab 711 may be connected to (or integrated with) negative DC power rail 740. FIG. 7D depicts a bottom view of power module 700 with second substrate 520 and switches (e.g., first switch 450, second switch 455, third switch 460, fourth switch 465, fifth switch 470, and sixth switch 475) removed.

Figure 8B:
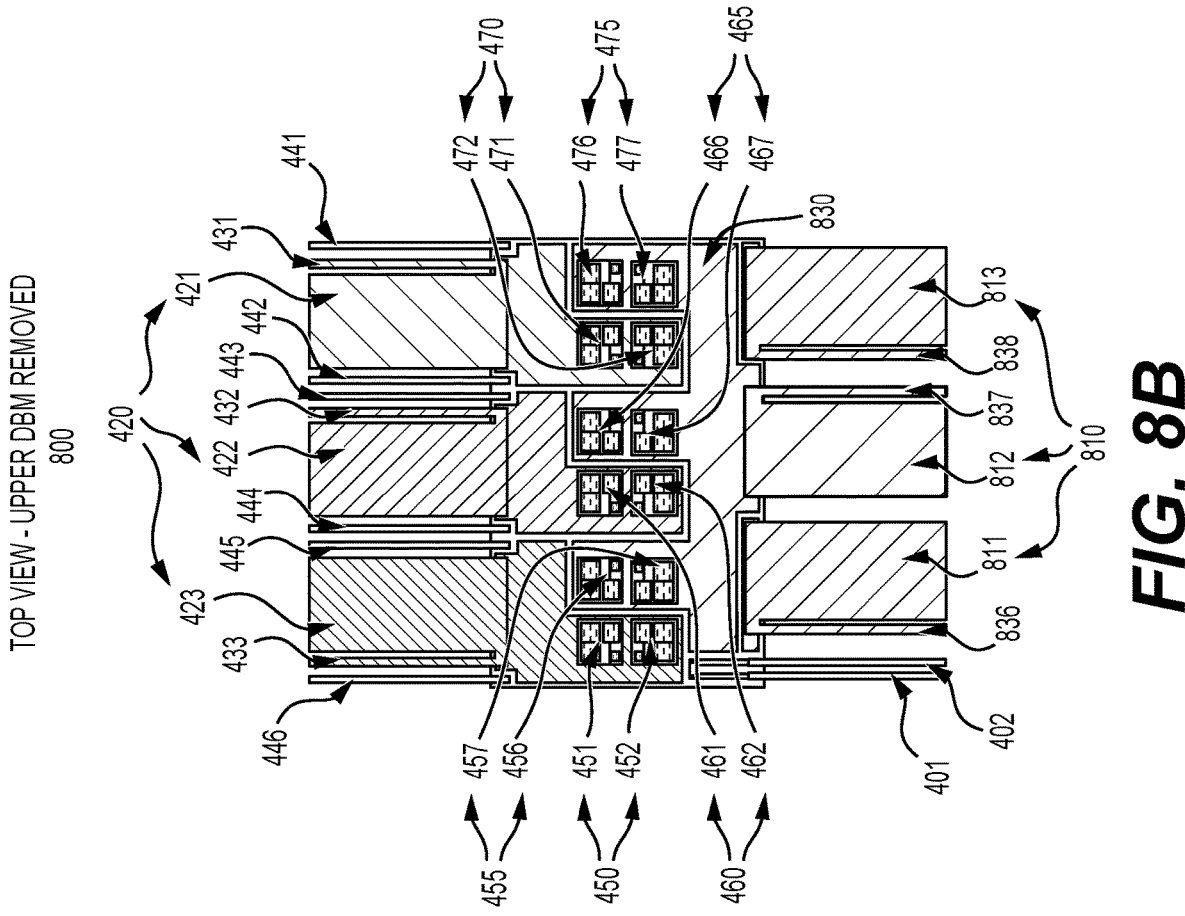
FIGS. 8A, 8B, 8C, and 8D depict top and bottom views of an exemplary power module, according to one or more embodiments.
Figure 8A:
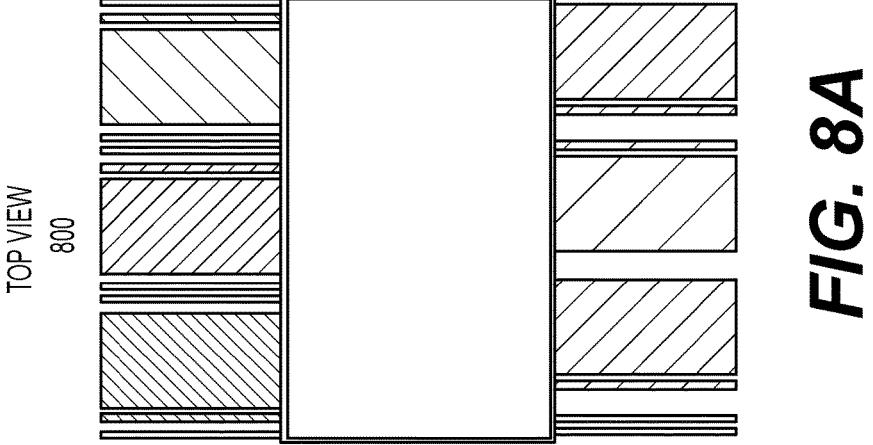

FIGS. 8A, 8B, 8C, and 8D depict top and bottom views of an exemplary power module, according to one or more embodiments. FIG. 8A depicts a top view of power module 800. With reference to FIG. 5, power module 800 may include first substrate 515 and second substrate 520. FIG. 8B depicts a top view of power module 800 with first substrate 515 removed. For brevity, power module 400 (See FIG. 4) and power module 800 may contain many similarities which will not be discussed. Power module 800 may include DC power tab group 810, which may be similar to DC power tab group 410 in FIG. 4. DC power tab group 810 of power module 800 may include a first negative DC power tab 811, a positive DC power tab 812, and a second negative DC power tab 813. First negative DC power tab 811 may include kelvin pin 836. Positive DC power tab 812 may include kelvin pin 837. Second negative DC power tab 813 may include kelvin pin 838. Positive DC power tab 812 may be connected to (or integrated with) positive DC power rail 830.

Figure 8D:
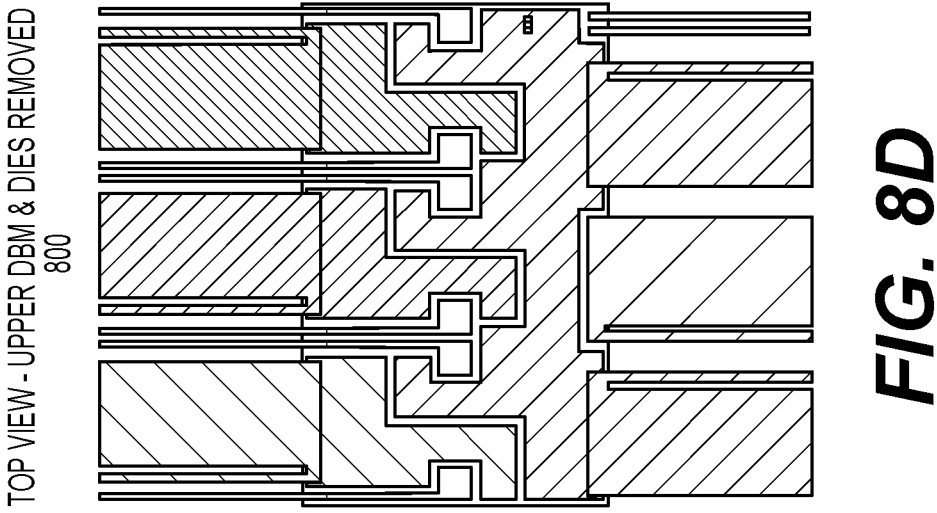
Figure 8C:
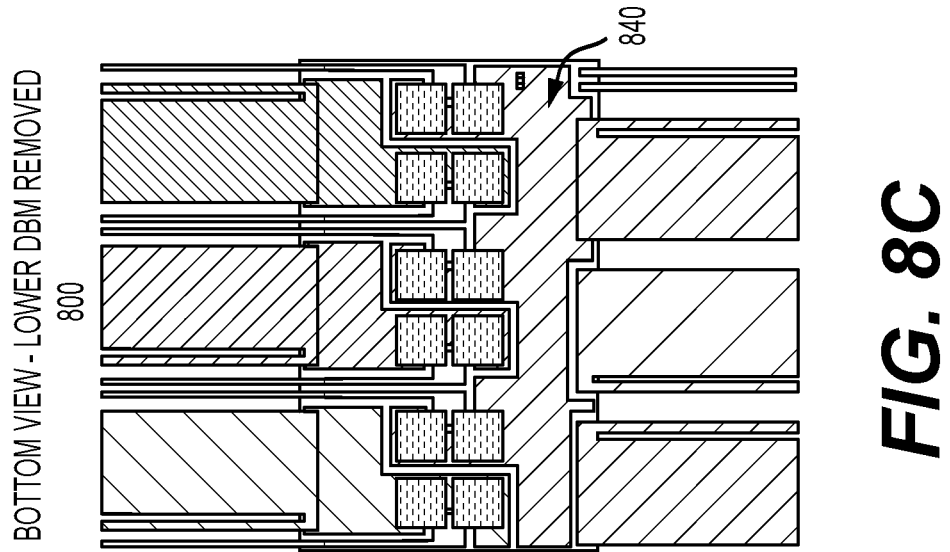

FIG. 8C depicts a bottom view of power module 800 with second substrate 520 removed. First negative DC power tab 811 and second negative DC power tab 813 may be connected to negative DC power rail 840. FIG. 8D depicts a bottom view of power module 800 with second substrate 520 and switches (e.g., first switch 450, second switch 455, third switch 460, fourth switch 465, fifth switch 470, and sixth switch 475) removed.

One or more embodiments may include the internal arrangement of DC+ and DC− leads that are overlapped on a portion on their respective area. The overlapping portions may result in a reduced stray inductance of this electrical connection, which may be beneficial for higher switching speed and higher efficiency. One or more embodiments may include a 12 die configuration (e.g., two dies per phase). One or more embodiments may include a 6 dies per power module (e.g., at minimum one die per phase) or 18 dies per power module (e.g., three dies per phase) or more if higher current capability is required.

One or more embodiments may include an area of each die that can be reduced (e.g., from approximately 28 mm$^2$ to approximately 15 mm$^2$) in order to fine tune the current capability regarding to the vehicle requirement. One or more embodiments may include a design compatible with an embedded decoupling capacitor installed between DC+ and DC− leads within the inter-DBM volume (e.g., closest to the dies) in order to achieve higher switching speed and increase efficiency.

One or more embodiments may provide advantages including high compacity, high power density, reduced stray inductance for increased efficiency, and low cost and scalable solutions for low power applications (e.g., vehicle segments A to C). One or more embodiments may provide improvements including the cost for the complete power module may be reduced compared to some power module designs with the six power switches, and the efficiency of the power module switching losses may be reduced due to the high switching speed capability allowed by low stray inductance (and optional embedded decoupling capacitors). One or more embodiments may include a design with a current density of approximately 4 Arms/mm$^2$, where pressure drop allocated to the power module may be focused on a smaller heat sink and thus a higher heat transfer coefficient may be achieved. One or more embodiments may include a 3D printed heat sink (e.g., removing the Thermal Interface Material layer on both sides) and dual side sintered dies. One or more embodiments may provide a power module with a high power density that may be compatible with segment A to C vehicles.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter to convert DC power from a battery to AC power to drive a motor, wherein the inverter includes:
a power module including:
one or more first switches to receive positive DC power to generate the AC power;
a positive DC power rail to provide the positive DC power to the one or more first switches;
one or more positive DC power tabs connected to the positive DC power rail;

one or more second switches to receive negative DC power to generate the AC power;
a negative DC power rail to provide the negative DC power to the one or more second switches;
one or more negative DC power tabs connected to the negative DC power rail; and
one or more AC power tabs to receive the AC power from the one or more first switches and the one or more second switches,
wherein the positive DC power rail is provided in a first plane on a first side of the one or more first switches and the one or more second switches, and the negative DC power rail is provided in a second plane on a second side of the one or more first switches and the one or more second switches and opposite to the first side.

2. The system of claim 1, wherein the one or more AC power tabs include:
a first AC power tab to be connected to a first phase of the motor;
a second AC power tab to be connected to a second phase of the motor; and
a third AC power tab to be connected to a third phase of the motor.

3. The system of claim 1, wherein the one or more first switches includes a first transistor and a second transistor, the first transistor and the second transistor configured to generate a single phase of the AC power.

4. The system of claim 1,
wherein the one or more positive DC power tabs include:
a first positive DC power tab connected to the positive DC power rail, and
a second positive DC power tab connected to the positive DC power rail, and
wherein the one or more negative DC power tabs include:
a first negative DC power tab connected to the negative DC power rail and provided between the first positive DC power tab and the second positive DC power tab.

5. The system of claim 1,
wherein the one or more negative DC power tabs include:
a first negative DC power tab connected to the negative DC power rail, and
a second negative DC power tab connected to the negative DC power rail, and
wherein the one or more positive DC power tabs include:
a first positive DC power tab connected to the positive DC power rail and provided between the first negative DC power tab and the second negative DC power tab.

6. The system of claim 1, wherein the power module further includes a high side gate pin and a low side gate pin.

7. The system of claim 1, wherein the one or more positive DC power tabs and the one or more negative DC power tabs are provided on an opposite side of the power module from the one or more AC power tabs.

8. The system of claim 1, wherein the inverter further includes one or more heat sinks for the power module.

9. The system of claim 1, further including:
the battery configured to supply the DC power to the inverter; and
the motor configured to receive the AC power from the inverter to drive the motor,
wherein the system is provided as a vehicle including the inverter, the battery, and the motor.

10. A system comprising a power module for an inverter, the power module including:

a positive DC power rail to provide positive DC power, the positive DC power rail including an inner layer and an outer layer;

a negative DC power rail to provide negative DC power, the negative DC power rail including an inner layer and an outer layer, wherein the inner layer of the negative DC power rail faces the inner layer of the positive DC power rail so that at least a portion of the negative DC power rail overlaps the positive DC power rail;

a first switch connected to the inner layer of the positive DC power rail to receive the positive DC power;

a second switch connected to the inner layer of the negative DC power rail to receive the negative DC power; and one or more AC power tabs to receive AC power from the first switch and the second switch.

11. The system of claim 10, the power module further including:

a first substrate including an inner layer and an outer layer, wherein the inner layer of the first substrate is connected to the outer layer of the positive DC power rail;

a second substrate including an inner layer and an outer layer, wherein the inner layer of the second substrate is connected to the outer layer of the negative DC power rail;

a first AC power rail connected to the inner layer of the first substrate, a first side of the first switch and the one or more AC power tabs; and a second AC power rail connected to the inner layer of the second substrate a second side of the second switch, and the one or more AC power tabs.

12. The system of claim 10, wherein the power module further includes:

a third switch connected to the inner layer of the positive DC power rail to receive positive DC power; and a fourth switch connected to the inner layer of the negative DC power rail to receive negative DC power, wherein a die planar orientation of the third switch is the same as a die planar orientation of the first switch, and a die planar orientation of the fourth switch is the same as a die planar orientation of the second switch.

13. The system of claim 12, wherein the power module further includes:

a fifth switch connected to the inner layer of the positive DC power rail to receive positive DC power; and a sixth switch connected to the inner layer of the negative DC power rail to receive negative DC power, wherein a die planar orientation of the fifth switch is the same as the die planar orientation of the first switch, and a die planar orientation of the sixth switch is the same as the die planar orientation of the second switch.

14. The system of claim 13, wherein:

the first switch and the second switch generate a first phase of the AC power, the third switch and the fourth switch generate a second phase of the AC power, and the fifth switch and the sixth switch generate a third phase of the AC power.

15. The system of claim 14, wherein the one or more AC power tabs include:

a first AC power tab to receive the first phase of the AC power and to be connected to a first phase of a motor;

a second AC power tab to receive the second phase of the AC power and to be connected to a second phase of the motor; and a third AC power tab to receive the third phase of the AC power and to be connected to a third phase of the motor.

16. The system of claim 10, wherein the power module further includes a high side gate pin and a low side gate pin.

17. The system of claim 10, wherein the first switch includes a first transistor and a second transistor, the first transistor and the second transistor configured to generate a single phase of the AC power.

18. A system including a power module, the power module including:

one or more first switches to receive positive DC power to generate AC power;

a positive DC power rail to provide positive DC power to the one or more first switches;

one or more positive DC power tabs connected to the positive DC power rail;

one or more second switches to receive negative DC power to generate the AC power;

a negative DC power rail to provide negative DC power to the one or more second switches;

one or more negative DC power tabs connected to the negative DC power rail; and one or more AC power tabs to receive the AC power from the one or more first switches and the one or more second switches, wherein the positive DC power rail is provided in a first plane on a first side of the one or more first switches and the one or more second switches, and the negative DC power rail is provided in a second plane on a second side of the one or more first switches and the one or more second switches and opposite to the first side.

19. The system of claim 18, further including:

a battery configured to supply the positive DC power and the negative DC power to the power module; and a motor configured to receive the AC power from the power module to drive the motor, wherein the system is provided as a vehicle including the power module, the battery, and the motor.

20. The system of claim 18, wherein the AC power is provided as one or more phases.

* * * * *